(12) United States Patent
Shen et al.

(10) Patent No.: US 11,301,091 B2
(45) Date of Patent: *Apr. 12, 2022

(54) TOUCH SENSOR CIRCUIT

(71) Applicant: TEXAS INSTRUMENTS INCORPORATED, Dallas, TX (US)

(72) Inventors: Ge Shen, Shanghai (CN); Jun Zhang, Shanghai (CN); Songhua Hu, Shanghai (CN); Yi Zhou, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/015,210

(22) Filed: Sep. 9, 2020

(65) Prior Publication Data
US 2020/0409492 A1 Dec. 31, 2020

Related U.S. Application Data

(63) Continuation of application No. 16/257,546, filed on Jan. 25, 2019, now Pat. No. 10,802,656, which is a continuation of application No. PCT/CN2018/103823, filed on Sep. 3, 2018.

(51) Int. Cl.
*G06F 3/044* (2006.01)
*G06F 3/041* (2006.01)

(52) U.S. Cl.
CPC ............ *G06F 3/044* (2013.01); *G06F 3/0416* (2013.01)

(58) Field of Classification Search
CPC ........... G06F 3/041–048; G06F 2203/041–048
See application file for complete search history.

(56) References Cited

U.S. PATENT DOCUMENTS

| 10,002,280 | B1 | 6/2018 | Ramberg |
| 10,042,484 | B1 | 8/2018 | O'Connor |
| 2006/0017710 | A1 | 1/2006 | Lee |
| 2006/0221061 | A1 | 10/2006 | Fry |
| 2011/0031042 | A1 | 2/2011 | Wu |
| 2013/0181947 | A1 | 7/2013 | Kwon |
| 2013/0328790 | A1 | 12/2013 | Liu |
| 2016/0216835 | A1 | 7/2016 | Takaba |
| 2016/0283035 | A1 | 9/2016 | Sandblad et al. |
| 2019/0199520 | A1 | 6/2019 | Kim |

OTHER PUBLICATIONS

Notification of Transmittal of the International Search Report and Th Written Opinion of the International Searching Authority, or the Declaration; dated May 29, 2019 PCT/CN2018/103823; 9 pages.

*Primary Examiner* — Sanjiv D. Patel
(74) *Attorney, Agent, or Firm* — Ebby Abraham; Charles A. Brill; Frank D. Cimino

(57) ABSTRACT

A circuit includes a timer to count edges of a clock from an initial count value to a terminal count value and to output a timer signal responsive to the terminal count value being reached. A random number generator circuit generates a plurality of random number values. Each generated random number value is sequentially loaded into the timer as one of the initial count value or the terminal count value. A capacitive sensor circuit determines, responsive to receipt of a plurality of timer signals from the timer, a touch event of a capacitive touch sensor.

13 Claims, 3 Drawing Sheets

TOUCH SENSOR CIRCUIT

CROSS-REFERENCE TO RELATED APPLICATIONS

This application is a continuation of U.S. patent application Ser. No. 16/257,546, filed on Jan. 25, 2019, which is a continuation of PCT/CN2018/103823, filed on Sep. 3, 2018, both of which are incorporated herein by reference in their entirety.

BACKGROUND

Touch sensors are ubiquitous and used for a variety of applications. In some applications, a touch sensor may result in a false touch determination based on the presence of noise. Some noise can be cyclic in nature and thus repeatedly occur when periodic sensor touch determinations are being made.

SUMMARY

In some implementations, a circuit includes a timer to count edges of a clock from an initial count value to a terminal count value and to output a timer signal responsive to the terminal count value being reached. A random number generator circuit generates a plurality of random number values. Each generated random number value is sequentially loaded into the timer as one of the initial count value or the terminal count value. A sensor circuit determines, responsive to receipt of a plurality of timer signals from the timer, a touch event of a touch sensor (e.g., a capacitive touch sensor).

BRIEF DESCRIPTION OF THE DRAWINGS

For a detailed description of various examples, reference will now be made to the accompanying drawings in which.

DETAILED DESCRIPTION

The circuits described herein include a random number generator circuit to generate a series of random numbers. Each generated random number is provided to a timer to be used by the timer to determine when to output a timer signal to be used to determine if a person is touching a touch sensor. By randomly spacing the trigger events for the touch sensor circuit, the circuit can more accurately determine a true touch event of the touch sensor, as opposed to false positives or false negatives.

Figure 1:
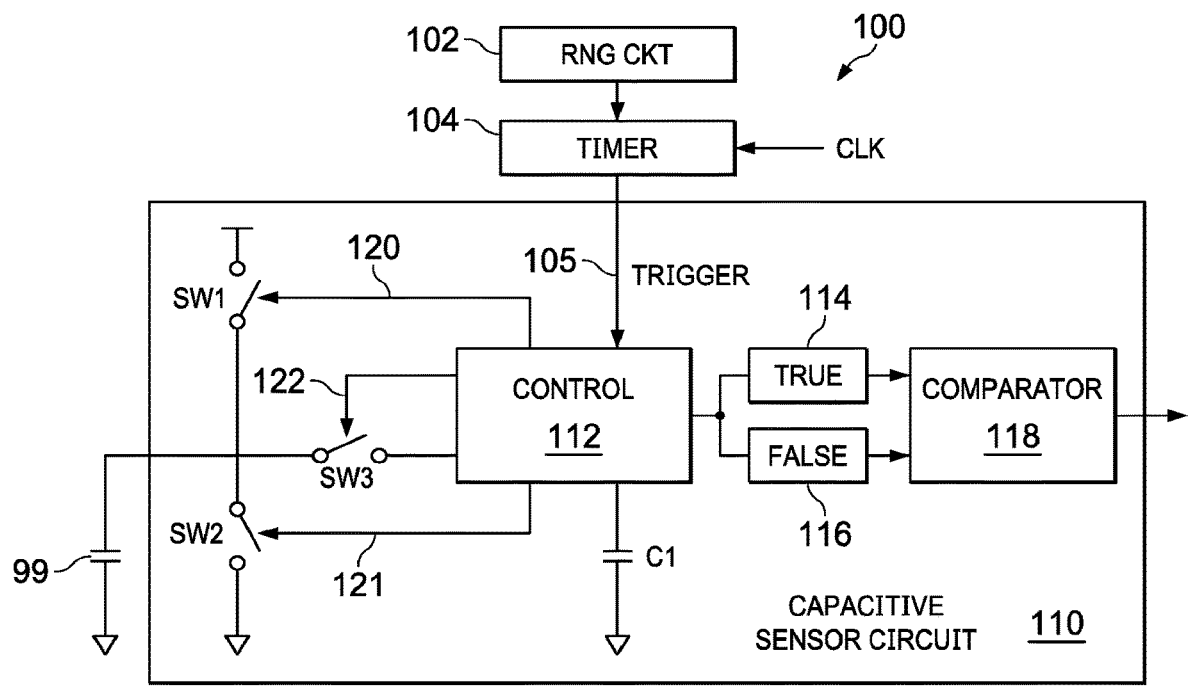
FIG. 1 illustrates an example of touch sensor circuit.

FIG. 1 shows an example of a circuit 100 that includes a random number generator (RNG) circuit 102, a timer 104, and a capacitive sensor circuit 110. A capacitive touch sensor 99 also is shown, which may be a separate component from the capacitive sensor circuit 110 or provided as part of the capacitive sensor circuit 110. Further, RNG circuit 102 and/or timer 104 may be part of, or separate from, capacitive sensor circuit 110. Further, sensor 99 is a capacitive-based touch sensor in the described examples and thus sensor circuit 110 is a capacitive-based sensor circuit. However, in other examples the sensor 99 is other than a capacitive-based sensor (e.g., a resistive-based sensor) and the sensor circuit 110 is a corresponding technology sensor circuit.

Timer 104 counts edges of a clock (CLK). In one example, the timer 104 is a count-up counter which counts up from an initial count value (e.g., 0) to a terminal count value. In another example, timer 104 is a count-down counter which counts down from an initial count value to a terminal count value (e.g., 0). Either of the initial count value or the terminal count value is programmable by a random number generated by the RNG circuit 102.

Responsive to timer 104 reaching the terminal count value, timer 104 generates a timer signal 105 (also referred to as a trigger signal) to trigger the capacitive sensor circuit 110 to determine if a person is touching capacitive touch sensor 99. Determining a touch event includes determining, for example, that the person's finger is touching the capacitive touch sensor 99 or is within a threshold distance of the capacitive touch sensor. Touching capacitive touch sensor 99 causes a change in the capacitance of the capacitive touch sensor to occur. The change in capacitance is detected by capacitive sensor circuit 110, as explained below, to determine whether a touch event is occurring.

Figure 3:
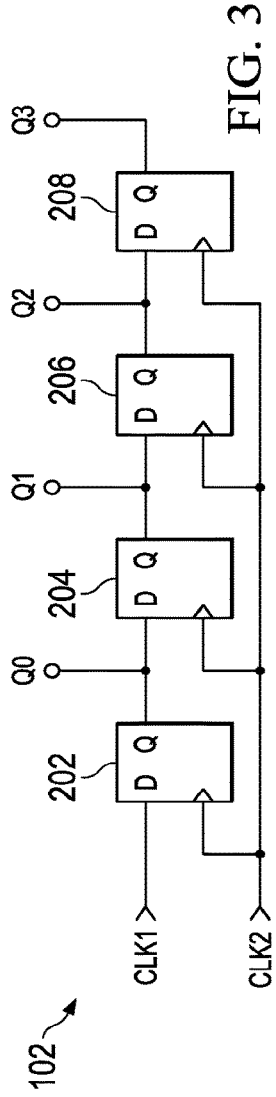
FIG. 3 illustrates an example of a random number generator circuit usable in the touch sensor circuits described in this disclosure.

The RNG circuit 102 is a hardware-based random number generator circuit that uses entropy of a circuit to generate random numbers. In one example, the RNG circuit 102 includes a series of flip-flops or a ring oscillator whose rising and falling edges vary based on thermal noise. The variation of the edges is random in nature and is used to generate a sequence of random bits. An example implementation of an RNG circuit 102 is shown in FIG. 3 and described below.

In operation, RNG circuit 102 generates a sequence of random values and sequentially loads those values into timer 104 as either the initial count value (in the example in which timer 104 is a count-down timer) or the terminal count value (in the example in which timer 104 is a count-up timer). In some examples, timer 104 reads a random number generated by RNG circuit 102 when timer 104 has generated a trigger signal 105 in order to obtain the next initial/terminal count value.

Trigger signal 105 is generated each time timer 104 reaches the terminal count value. In some examples, trigger signal 105 is a pulse generated by the timer 104. Timer 104 thus generates a sequence of trigger signals 105 spaced apart by varying time periods as a result of the random numbers generated by the RNG circuit 102 and used by timer 104.

Figure 2:
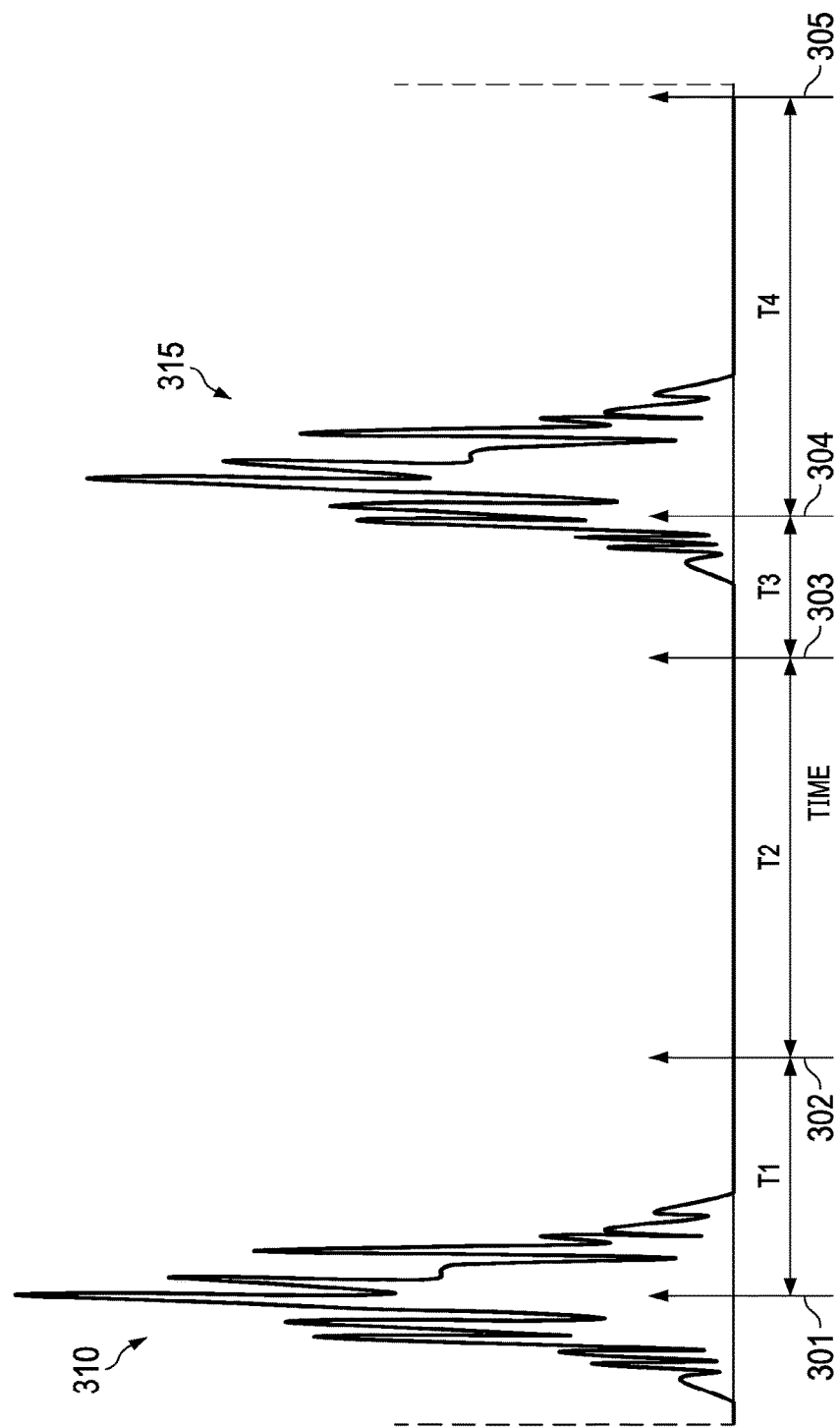
FIG. 2 shows an example of randomly spaced touch events relative to noise.

FIG. 2 illustrates a time sequence of trigger events 301, 302, 303, 304, and 305. Each trigger event is initiated by timer 104 asserting a trigger signal 105. The time interval between trigger events 301 and 302 is T1. The time interval between trigger events 302 and 303 is T2. The time interval between trigger events 303 and 304 is T3, and the time interval between trigger events 304 and 305 is T4. The sizes of T1, T2, T3, and T4 are different and are based on the random numbers provided by the RNG circuit 102 to timer 104 to be used to determine when to generate the trigger signals 105 as described above.

The example of FIG. 2 shows five trigger events 301-305 in the midst of noise shown at 310 and 315. In some examples, the total elapsed time of the five trigger events (T1+T2+T3+T4) is short enough to occur while a person touches the capacitive touch sensor 99. For example, a person might momentarily touch the capacitive touch sensor 99 to cause an action to occur (e.g., turn on a light) and a person might normally touch the sensor for one second. The total elapsed time of the five trigger events may be on the order of milliseconds. In one example, the time between trigger events ranges from 500 microseconds to 20 milliseconds.

Figure 4:
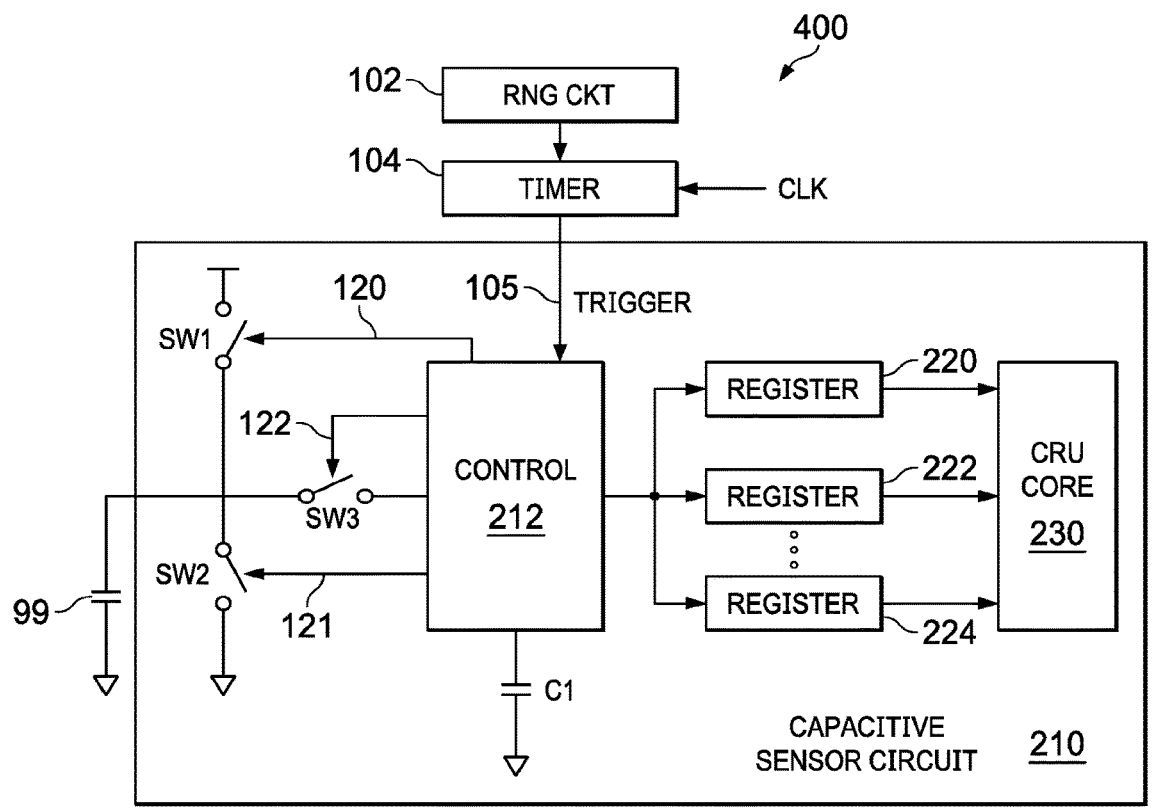
FIG. 4 illustrates another example of touch sensor circuit.

In the example of FIG. 2 the noise shown at 310 and 315 happens to correspond to trigger events 301 and 304, respectively. Because of the noise 310 and 315 at trigger events 301 and 304, the capacitive sensor circuit 110 may or may not correctly detect a touch event. For example, the capacitive sensor circuit 110 may incorrectly determine a false negative, that is, the capacitive sensor circuit failed detect a touch event due to the noise when, in fact, a person was touching the capacitive touch sensor 99. The other three trigger events 302, 303 and 305 occur without the presence of noise and result in correctly determining a touch event. As such, if a person is touching the capacitive touch sensor 99 while each of the trigger events 301-305 occurs, capacitive sensor circuit 110 may detect a false negative for trigger events 301 and 304 but a correct positive for trigger events 302, 304 and 305. If the time spacing between trigger events was periodic (evenly spaced) and consistent with the spacing between noise events, then it would be possible for the trigger events to occur only or mostly during noise events thereby making a touch sensor circuit inaccurate. By randomly spacing the trigger events, the probability increases that the trigger events will not coincide as often with the noise events. The example capacitive sensor 110 of FIG. 1 as well as the example capacitive sensor circuit 410 of FIG. 4 are described below to illustrate how a correct determination of a touch event can be made based on multiple touch event determinations from a series of trigger events.

Referring again to FIG. 1, capacitive sensor circuit 110 includes a control circuit 112, switches SW1, SW2, and SW3, charge transfer capacitor C1, a true register 114, a false register 116, and a comparator 118. In some examples, control circuit 112 is implemented as a finite state machine. In some examples, control circuit 112 is a finite state machine. Control circuit 112 asserts control signals 120, 121, and 122 to control the open/closed (on/off) state of switches SW1, SW2, and SW3, respectively. When SW1 is closed and SW2 is open, the capacitive touch sensor is charged. During this charge phase, SW3 is open as well. During a discharge phase, SW1 is opened and SW2 and SW3 are closed thereby causing capacitive touch sensor 99 to discharge current through the control circuit 112. The charge from capacitive touch sensor 99 is used to charge the charge transfer capacitor C1. Control circuit 112 calculates the amount of charge transferred between capacitive touch sensor 99 to the charge transfer capacitor. Control circuit 112 then closes SW1 and opens SW2 and SW3 to again charge the capacitive touch sensor 99. Control circuit 112 operates the switches to repeatedly charge capacitive touch sensor 99 and then transfer its charge onto charge transfer capacitor C1 while calculating the amount of charge transferred in each cycle. The process repeats over and over until the aggregate amount of charge reaches a threshold level. The amount of charge transferred in each cycle is a function of the capacitance of the capacitive touch sensor 99 and the capacitance of the capacitive touch sensor is influenced by whether or not a person is touching the capacitive touch sensor. As such, the number of charge/discharge cycles can be used to determine whether a touch event is occurring. If capacitive touch sensor 99 is not being touched, its capacitance will be lower (than if it was being touched) and less charge will be stored in capacitive touch sensor 99. As a result, less charge will be transferred each cycle to charge transfer capacitor C1 and thus more cycles will be needed to reach the aggregate charge threshold.

If, however, capacitive touch sensor 99 is being touched, its capacitance will be higher (than if it was not being touched) and more charge will be stored in capacitive touch sensor 99. Consequently, more charge will be transferred each cycle to charge transfer capacitor C1 and thus fewer cycles will be needed to reach the aggregate charge threshold. As such, the number of cycles required to reach the aggregate charge threshold can be used to determine whether a true or a false touch event has occurred. A true touch event means that capacitive touch sensor 99 is being touched during the repeated charge/discharge phases. A false touch event touch event means that the capacitive touch sensor 99 is not being touched during the repeated charge/discharge phases.

Each time a trigger signal 105 is provided to control circuit 110, the control circuit initiates a sequence of charge/discharge phases as described above until the aggregate charge threshold is reached. The number of charge/discharge phases is then compared to a threshold. Control circuit 110 determines that a true touch event has occurred responsive to the number of charge/discharge phases being below the threshold, or that a true touch event has not occurred (i.e., a false touch event) responsive to the number of charge/discharge phases being above the threshold. The threshold is predetermined or configurable.

Responsive to the determination that a true touch event has occurred for a given trigger event, control circuit 112 loads a true touch result into true register 114. Responsive to the determination of a false touch event, control circuit 112 loads a false touch result into false register 116. In some implementations, each true or false touch result comprises a logic 1 written or aggregated into the respective register 114, 116. Comparator 118 can be implemented as a multi-bit comparator to compare one multibit value to another multibit value. In some examples, comparator 118 is implemented as combinatorial logic including a plurality of logic gates or other types of digital circuit components. Comparator 118 compares the number of true touch results loaded into the true register 114 to the number of false touch results loaded into the false register. Comparator 118 outputs a signal indicating a true touch event has occurred responsive to the number of true touch results exceeding the number of false touch results. Comparator 118 outputs a signal indicating a false touch event has occurred responsive to the number of false touch results exceeding the number of true touch results. In some examples, the number of trigger events on which the true/false touch event determination is made is an odd number and is 3 or greater.

FIG. 3 shows an example of RNG circuit 102. This example includes flip-flops 202, 204, 206, and 208 coupled in series. In this example, a series chain of four flip-flops is shown, but other examples may include a different number of flip-flops. The Q output of one flip-flop couples to the data (D) input of the next flip-flop in the series chain. A first clock (CLK1) is provided to the D input of flip-flop 202. Each of the flip-flops is clocked by a second clock (CLK2) as shown. In some examples, the frequency of CLK1 is greater than the frequency of CLK2. The random number generated by flip-flops 202-208 represents the Q outputs of the flip-flops (e.g., Q0, Q1, Q2, and Q3 as shown in the example of FIG. 2). CLK1 has a higher frequency than CLK2. CLK1 also is independent of, and asynchronous to, CLK2. When a rising edge of CLK2 occurs to drive flip-flop 202, the D input from CLK1 may be 0 or 1. This is a random result related to CLK1 and CLK2 initial phase, frequency, clock skew, jitter and so on. This random value at the D inputs will be transferred to Q0 which is also provided to the D input of the next flip-flop 204. This process is repeated four times in this example to obtain Q0 to Q3 and thus Q0-Q3 comprise four random bit values (a four-bit random number).

FIG. 4 shows an example of a circuit 400 including RNG circuit 102 and timer 104 as described above. The example of FIG. 4 includes a capacitive sensor circuit 210 that includes a control circuit 212, switches SW1, SW2, and SW3, charge transfer capacitor C1, a plurality of registers 220, 222, and 224, and a central processing unit (CPU) core 230. Three registers 220-224 are shown in this example, but more than three are included in other implementations. For example, for a circuit that makes a true/false determination based on five trigger events, capacitive sensor circuit 210 includes five registers. The control circuit 212 operates in much the same way as described above to effectuate multiple charge/discharge phases. Rather than loaded in true or false touch event into a register, control circuit 212 in this example loads a sensor count value indicative of the number of charge/discharge phases that were required to reach the aggregate charge threshold. CPU core 230 then reads the sensor count values from registers 220-224 and computes a metric based on the sensor count values from registers 220-224. In some implementations, the metric comprises an average. CPU core 230 then determines whether the computed metric is above or below a threshold. If the metric is below the threshold, CPU core 230 determines that a true touch event has occurred. If the metric is above the threshold, CPU core 230 determines that a false touch event has occurred.

Figure 5:
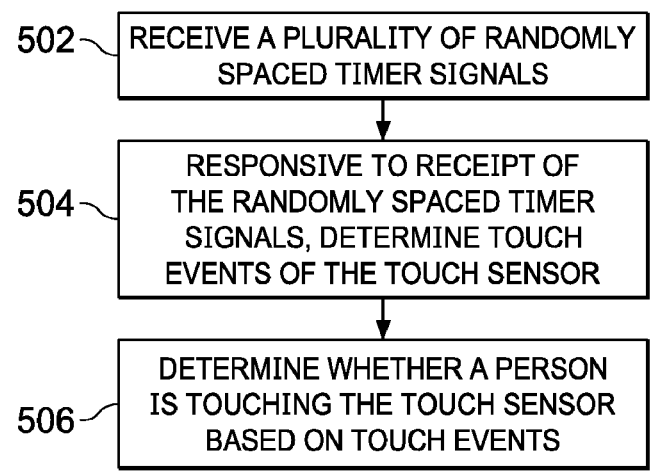
FIG. 5 shows an example of a method.

FIG. 5 shows a method flow chart comprising operations 502, 504, and 506. At 502, the method includes receiving a plurality of randomly spaced timer signals. The RNG circuit 102 can be used in this regard to control the operation of the timer 104 as explained above. The randomly spaced timer signals can be received by the capacitive sensor circuit 110, 210.

At 504, the method includes determining touch events of the touch sensor responsive to the receipt of the randomly spaced timer signals. At 506, the method includes determining whether a person is touching the touch sensor (e.g., sensor 99) based on the touch events. The example of FIG. 1 comprises one technique for determining whether a person is touching the sensor and FIG. 4 comprises another technique for determining whether a person is touching the sensor.

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors.

Modifications are possible in the described embodiments, and other embodiments are possible, within the scope of the claims.

What is claimed is:

1. A circuit, comprising:
   a timer configured to:
     count edges of a clock to a terminal count value; and
     output a timer signal responsive to the terminal count value being reached;
   a random number generator circuit coupled to the timer and configured to:
     generate a random number value; and
     loading the generated random number value as the terminal count value; and
   a capacitive sensor circuit coupled to the timer and adapted to be coupled to a capacitive touch sensor, the capacitive sensor circuit configured to determine, responsive to receiving a timer signal from the timer, a touch event of the capacitive touch sensor.

2. The circuit of claim 1, wherein the capacitive sensor circuit includes:
   a first register;
   a second register; and
   a control circuit to receive each timer signal and, responsive to each timer signal, to load a true touch result into the first register or a false touch result into the second register.

3. The circuit of claim 2, further comprising a comparator to determine whether a number of true touch results exceeds a threshold.

4. The circuit of claim 1, wherein the capacitive sensor circuit includes:
   a plurality of N registers;
   a control circuit to receive N timer signals and, for each of the N timer signals, to load a sensor count value into a corresponding register; and
   a processor core to compute a metric based on the sensor count values from the plurality of N registers and to determine whether the computed metric exceeds a first threshold.

5. The circuit of claim 4, wherein each sensor count value is indicative of a number of cycles that occurred to transfer enough charge from the capacitive touch sensor to a charge transfer capacitor to exceed a second threshold.

6. The circuit of claim 4, wherein the metric comprises an average of the sensor count values.

7. The circuit of claim 1, wherein the random number generator circuit includes a ring oscillator.

8. The circuit of claim 1, wherein the plurality of timer signals includes at least three timer signals and is an odd number.

9. The circuit of claim 1, wherein the capacitive sensor circuit includes:
   a charge transfer capacitor;
   a first switch coupled to a supply voltage node and to be coupled to the capacitive touch sensor;
   a second switch coupled to a ground node and to be coupled to the capacitive touch sensor; and
   a third switch to be coupled to the capacitive touch sensor.

10. A method, comprising:
    generating a random number value;
    loading the random number value as a terminal count value;
    counting edges of a clock to the terminal count value;
    determining touch events of a touch sensor in response to the terminal count value being reached.

11. The method of claim 10, further comprising loading true touch results into a first register responsive and false touch results into a second register.

12. The method of claim 11, further comprising determining whether a number of true touch results from the first register exceeds a threshold.

13. The method of claim 10, further comprising:
    for each of N timer signals, loading a sensor count value into one of N registers;
    computing, by a processor core, a metric based on the sensor count values from the N registers; and
    determining whether the computed metric exceeds a first threshold.

* * * * *